(12) United States Patent
Shigihara

(10) Patent No.: US 8,582,617 B2
(45) Date of Patent: Nov. 12, 2013

(54) SEMICONDUCTOR LASER

(75) Inventor: Kimio Shigihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 82 days.

(21) Appl. No.: 13/424,475

(22) Filed: Mar. 20, 2012

(65) Prior Publication Data

US 2013/0016753 A1 Jan. 17, 2013

(30) Foreign Application Priority Data

Jul. 13, 2011 (JP) ................................. 2011-154934

(51) Int. Cl.
*H01S 5/00* (2006.01)

(52) U.S. Cl.
USPC ............. 372/50.11; 372/49.01; 372/102; 372/43.01; 372/44.011; 372/50.1

(58) Field of Classification Search
USPC ........... 372/49.01, 50.11, 102, 43.01, 44.011, 372/50.1
See application file for complete search history.

(56) References Cited

U.S. PATENT DOCUMENTS

| | | | | |
|---|---|---|---|---|
| 5,043,994 A | * | 8/1991 | Ikeda et al. | 372/45.01 |
| 5,864,574 A | * | 1/1999 | Welch et al. | 372/50.22 |
| 6,064,685 A | * | 5/2000 | Bissessur et al. | 372/102 |
| 6,293,688 B1 | * | 9/2001 | Deacon | 362/556 |
| 6,885,793 B2 | * | 4/2005 | Macomber | 385/37 |
| 7,245,803 B2 | * | 7/2007 | Gunn et al. | 385/37 |
| 7,961,765 B2 | * | 6/2011 | Jones | 372/26 |
| 8,223,811 B2 | * | 7/2012 | Jones | 372/26 |
| 2001/0028769 A1 | * | 10/2001 | Deacon | 385/50 |
| 2004/0252942 A1 | * | 12/2004 | Macomber | 385/37 |
| 2005/0238079 A1 | * | 10/2005 | Botez | 372/96 |
| 2006/0256829 A1 | * | 11/2006 | Koyata et al. | 372/96 |
| 2009/0232169 A1 | * | 9/2009 | Koyata et al. | 372/22 |
| 2012/0177077 A1 | * | 7/2012 | Erbert et al. | 372/50.11 |

FOREIGN PATENT DOCUMENTS

| | | |
|---|---|---|
| JP | 6-313818 A | 11/1994 |
| JP | 2004-165383 A | 6/2004 |

* cited by examiner

*Primary Examiner* — Jessica Stultz
*Assistant Examiner* — Delma R Forde
(74) *Attorney, Agent, or Firm* — Leydig, Voit & Mayer, Ltd.

(57) ABSTRACT

An 830 nm broad area semiconductor laser having a distributed Bragg reflector (DBR) structure. The semiconductor laser supports multiple horizontal transverse modes of oscillation extending within a plane perpendicular to a crystal growth direction of the laser, in a direction perpendicular to the length of the resonator of the laser. The resonator includes a diffraction grating in the vicinity of the emitting facet of the laser. The width of the diffraction grating in a plane perpendicular to the growth direction and perpendicular to the length of the resonator is different at first and second locations along the length of the resonator. The width of the diffraction grating along a direction which is perpendicular to the length of the resonator increases with increasing distance from the front facet of the semiconductor laser.

5 Claims, 9 Drawing Sheets

FRONT FACET — LENGTH DIRECTION OF THE RESONATOR — REAR FACET

FRONT FACET     LENGTH DIRECTION     REAR FACET
OF THE RESONATOR

SEMICONDUCTOR LASER

FIELD OF THE INVENTION

The present invention relates to a semiconductor laser.

BACKGROUND ART

Solid state lasers, such as Nd-doped YAG (Nd:YAG) lasers and Yb-doped YAG (Yb:YAG) lasers, Yb-doped fiber lasers, and Er-doped fiber amplifiers, etc. employ a semiconductor laser as their pumping source.

Conventional semiconductor lasers are disclosed, e.g., in Japanese Laid-Open Patent Publication No. 2004-165383, etc. In typical conventional semiconductor lasers, the width of the diffraction grating perpendicular to the length direction of the resonator is uniform along the length of the resonator, as described on page 28 and shown in FIG. 11, etc. of this publication.

Japanese Laid-Open Patent Publication No. H06-313818 discloses a semiconductor laser configured in such a manner that the diffraction grating has a dimension varying periodically along the length of the resonator. However, since the diffraction grating in the semiconductor laser described in this publication extends a relatively long distance along the length of the resonator, the semiconductor laser does not fall into the category of a DBR semiconductor layer, in which a diffraction grating is provided only in the vicinity of the emitting facet of the resonator.

Broad area semiconductor lasers permit a plurality of horizontal transverse modes which extend within a plane perpendicular to the crystal growth direction in a direction perpendicular to the length direction of the resonator. More specifically, in the case of longitudinal modes in a broad area semiconductor laser, they can be controlled by use of a diffraction grating so that the lasing wavelength is equal or approximately equal to the wavelength of the single longitudinal mode.

In the case of horizontal transverse modes, however, a number of modes including low order modes to high order modes appear in the semiconductor laser, since there is little difference between the reflectances of the diffraction grating in these modes. As a result, conventional broad area semiconductor lasers lase in many horizontal transverse modes, making it difficult to condense the light without the need for an additional complicated optical system.

The present invention has been made to solve the foregoing problem. It is, therefore, an object of the present invention to provide an improved semiconductor laser which lases in lower order horizontal transverse modes.

SUMMARY OF THE INVENTION

According to a first aspect of the present invention, a semiconductor laser permits a plurality of horizontal transverse modes which extend within a plane perpendicular to a crystal growth direction in a direction perpendicular to a length direction of a resonator. The semiconductor laser includes a DBR structure. The DBR structure has a diffraction grating provided in a vicinity of an emitting facet. The width of the diffraction grating along the plane and perpendicular to the length direction of the resonator is different at a first location than at a second location along a length of the resonator.

According to a second aspect of the present invention, a semiconductor laser has a DBR structure. The semiconductor laser includes a front facet for emitting laser light, a rear facet, stripe region and a DBR layer. The rear facet is located at an opposite end of the semiconductor laser to the front facet. The stripe region extends from the front facet to the rear facet. The DBR layer includes a diffraction grating formed in a region near the front facet, and the region overlaps the stripe region. A part of the diffraction grating at a longitudinal edge of the stripe region is smaller than a part of the diffraction grating at a longitudinal center of the stripe region.

In accordance with the present invention there are provided semiconductor lasers wherein a diffraction grating is provided in the vicinity of the laser light-emitting front facet of the resonator and wherein the width of the diffraction grating varies along the length of the resonator so that the reflectance in the stripe region increases as the longitudinal center line of the stripe region is approached from the longitudinal edges of the stripe region. This reflectance distribution reduces the mirror loss in low order horizontal transverse modes so that the laser can lase in low order horizontal transverse modes.

DETAILED DESCRIPTION OF THE PREFERRED EMBODIMENTS

First Embodiment

Figure 1:
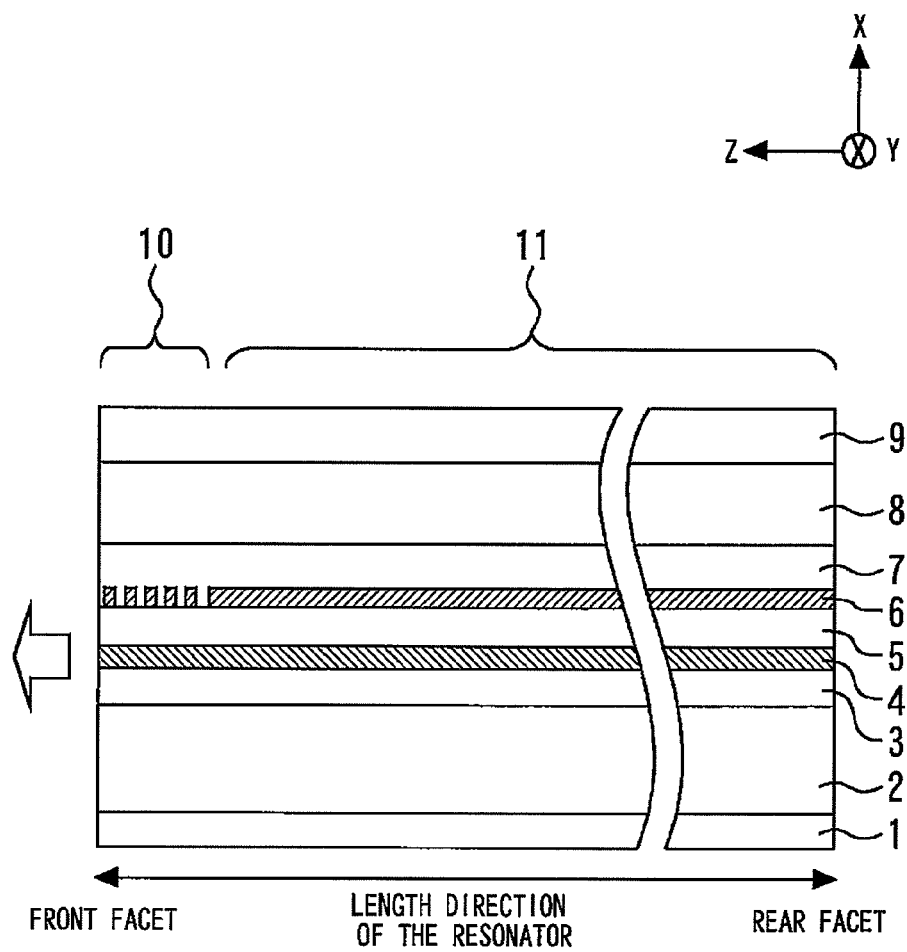
FIG. 1 is a cross-section view of an broad area semiconductor laser in accordance with a first embodiment of the present invention taken along the length of the resonator.

FIG. 1 is a cross-section view of an 830 nm broad area semiconductor laser in accordance with a first embodiment of the present invention taken along the length of the resonator (this semiconductor laser being hereinafter also referred to simply as the semiconductor laser of the first embodiment). The reference numerals in FIG. 1 denote the following components: 1, an n-type GaAs substrate; 2, an n-type $(Al_{0.30}Ga_{0.70})_{0.51}In_{0.49}P$ cladding layer with a thickness of 2 µm; 3, an undoped $Al_{0.4}Ga_{0.6}As$ light guiding layer with a thickness of 15 nm; 4, an undoped GaAs active layer with a thickness of 6 nm; 5, an undoped $Al_{0.4}Ga_{0.6}As$ light guiding layer with a thickness of 15 nm; 6, a p-type $Al_{0.6}Ga_{0.4}As$ DBR forming layer with a thickness of 25 nm; 7, a p-type $Al_{0.4}Ga_{0.6}As$ DBR burying layer with a thickness of 50 nm; 8, a p-type $(Al_{0.30}Ga_{0.70})_{0.51}In_{0.49}P$ cladding layer with a thickness of 2 μm; and 9, a p-type GaAs contact layer with a thickness of 0.3 μm. These layers are sequentially grown in crystal form in the X-axis direction of FIG. 1, thereby forming the broad area semiconductor laser shown in FIG. 1. The reference numeral 10 denotes the DBR (Distributed Bragg Reflector) section and 11 denotes the FP (Fabry-Perot) section. Thus the semiconductor laser of the first embodiment has a DBR structure.

Though not shown in FIG. 1, an n-electrode is provided on the bottom side of the n-type GaAs substrate 1, and a p-electrode is provided on the p-type GaAs contact layer 9. A voltage is applied to these electrodes so that laser light is emitted from the front facet in the direction of the white arrow of FIG. 1.

The diffraction grating in the DBR section 10 is formed by first etching away a series of spaced portions of the DBR forming layer thereby forming a repeating series of ridges and trenches, and then growing the DBR burying layer on the surface.

For convenience of explanation, FIG. 1 shows X-, Y-, and Z-axes, together with the semiconductor laser of the first embodiment. The X-axis coincides with the crystal growth direction in the semiconductor laser of the first embodiment (i.e., the direction in which each layer is grown in crystal form on the n-type GaAs substrate 1). The Z-axis coincides with the length direction of the resonator of the semiconductor laser of the first embodiment. The Y-axis is orthogonal to the X-axis and the Z-axis (or the length direction of the resonator). The Y-axis, together with the X- and Z-axes, is used to indicate the positions of the components (described later) of the diffraction grating of the first embodiment in a coordinate system.

Figure 2:
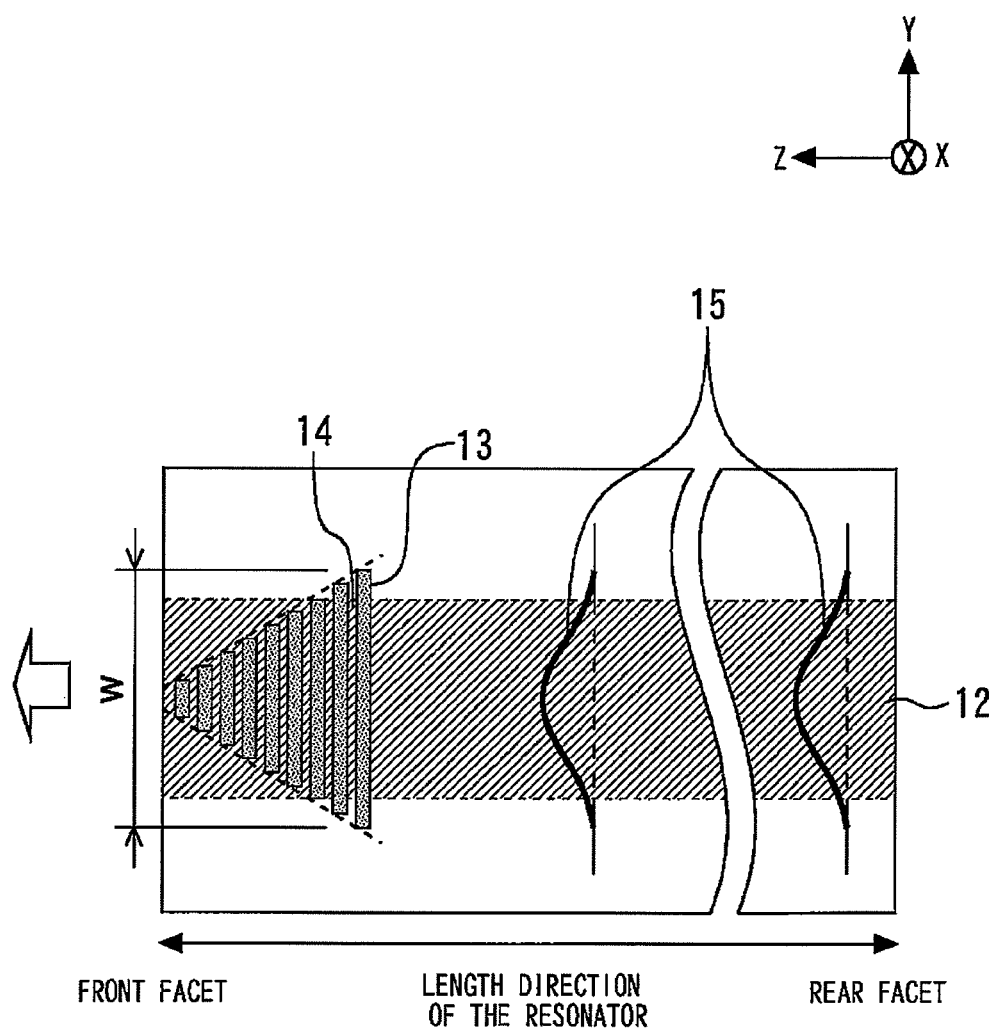
FIG. 2 is a schematic diagram showing the diffraction grating section of the broad area semiconductor laser of the first embodiment.

FIG. 2 is a schematic diagram showing the diffraction grating section of the broad area semiconductor laser of the first embodiment. In FIG. 2, the reference numeral 12 denotes the stripe region of the broad area semiconductor laser. The X-, Y-, and Z-axes shown in FIG. 2 correspond to the X-, Y-, and Z-axes, respectively, of FIG. 1. Further, the letter W in FIG. 2 indicates the width dimension of the diffraction grating structure (described below), for convenience.

FIG. 2 schematically shows the surface (Y-Z plane) of the p-type $Al_{0.6}Ga_{0.4}As$ DBR forming layer 6 after the layer has been formed and after a repeating series of ridges and trenches have been formed therein by etching away a series of spaced portions of the layer, with the ridges and trenches together forming a diffraction grating. That is, the trenches are etched-away portions, and each ridge is located between adjacent trenches. The reference numeral 13 is used to denote the trenches, and the reference numeral 14 is used to denote the ridges. As shown in FIG. 2, the trenches 13 and the ridges 14 are formed in the front end portion (or the DBR section 10) of the stripe region 12 in such a manner that each ridge 14 is located between adjacent trenches 13. The diffraction grating extends across the surface of the DBR forming layer 6 perpendicular to the crystal growth direction, and has a triangular shape with an apex lying on the front end of the stripe region, as shown in FIG. 2. In FIG. 2, the reference numeral 15 denotes the fundamental (or zeroth order) mode electric field pattern (schematically shown) which propagates through the stripe region of the broad area semiconductor laser.

Thus, as shown in FIG. 2, the width W of the diffraction grating along the Z-Y plane in the Y-direction, which is perpendicular to the length direction of the resonator (Z-direction), gradually increases with increasing distance from the front facet of the semiconductor laser toward the rear facet thereof. In accordance with the present embodiment, the widths of the widest trench 13 and the widest ridge 14 (i.e., the rightmost trench 13 and the rightmost ridge 14 as viewed in FIG. 2) of the diffraction grating are greater than the width of the stripe region 12.

More specifically, the width of the diffraction grating of the present embodiment shown in FIG. 2 continuously increases with increasing distance from the front facet toward the rear facet, in accordance with the equation: the width=1−cos (aZ'), where α is a constant and Z' is the distance from the front facet toward the rear facet. The zeroth order mode electric field distribution within the stripe is such that the electric field intensity varies in accordance with the equation: the electric field intensity=cos (bY), where b is a constant and Y is the distance from the longitudinal center line of the stripe (i.e., Y=0 at the longitudinal center line). That is, the electric field intensity is highest at the longitudinal center line of the stripe and decreases with increasing distance from the longitudinal center line toward the longitudinal edges of the stripe, in accordance with the equation: the electric field intensity=cos (bY). In the semiconductor laser of the present embodiment, in order to match the configuration of the diffraction grating to this electric field distribution, the width of the diffraction grating is designed to continuously increase with increasing distance from the front facet in accordance with the equation: the width=1−cos (aZ'), where α is a constant.

In the semiconductor laser of the present embodiment, as shown in FIG. 2, the area of the stripe region 12 covered by the diffraction grating increases as the longitudinal center line of the stripe region 12 is approached from the longitudinal edges of the stripe region 12 (i.e., the upper and lower edges of the region as viewed in FIG. 2), a smaller amount of the diffraction grating is formed in the vicinity of the longitudinal edges of the stripe region (i.e., the upper and lower edges of the region as viewed in FIG. 2), and, on the other hand, a larger amount of the diffraction grating is formed at the longitudinal center of the stripe region. That is, in the semiconductor laser of the present embodiment, as shown in FIG. 2, the area of the stripe region 12 covered by the diffraction grating increases as the longitudinal center line of the stripe region 12 is approached from the longitudinal edges of the stripe region 12 (i.e., the upper and lower edges of the region as viewed in FIG. 2). Thus, the diffraction grating is configured to have such unequal distribution so that the reflectance in the stripe region increases as the longitudinal center line of the stripe region is approached from the longitudinal edges of the region.

Of the multiple horizontal transverse mode electric fields propagating through the stripe region of a broad area semiconductor laser, lower order horizontal transverse mode fields are stronger at the longitudinal center portion of the stripe, whereas higher order horizontal transverse mode fields are stronger at the longitudinal edge portions of the stripe. It should be noted that in the semiconductor laser shown in FIG. 2, the diffraction grating is configured to have a width which varies along the length of the resonator so that the reflectance in the stripe decreases with increasing distance from the longitudinal center line of the stripe toward the longitudinal edges thereof. This means that lower order ones of the multiple horizontal transverse mode electric fields propagating through the stripe region are reflected more strongly by the diffraction grating than are higher order ones. The higher the reflection, the lower the mirror loss, and hence the lower the gain required for lasing action. Thus, the zeroth order or near zeroth order horizontal transverse modes of lasing can be achieved by varying the width of the diffraction grating along the length of the stripe so that the reflectance in the stripe is higher at the longitudinal center portion of the stripe and lower at the longitudinal edge portions of the stripe.

Thus, the broad area semiconductor laser of the first embodiment described above has an improved configuration and can lase in a lower order horizontal transverse modes, making it easy to condense the light without the need for an additional complicated optical system.

In accordance with the first embodiment, the width of the diffraction grating varies along the length of the resonator in accordance with the equation: the width=1−cos (aZ'). It is to be understood, however, that the present invention is not limited to this particular function. The width of the diffraction grating may be varied linearly, or varied in accordance with a quadratic curve or any other suitable type of curve, with the effect. Further, although the present embodiment has been described in connection with an 830 nm broad area semiconductor laser having a GaAs active layer, it is to be understood that the present invention is not limited to this particular type of semiconductor laser, but may be applied to InGaAsP-based long wavelength broad area semiconductor lasers and other suitable broad area semiconductor lasers having different wavelengths.

It should be noted that since the semiconductor laser of the above embodiment is a broad area semiconductor laser, it has a structure that permits (or supports) a plurality of horizontal transverse modes which extend within a plane perpendicular to the crystal growth direction in a direction perpendicular to the length direction of the resonator. However, the semiconductor laser of the present embodiment can lase in the zeroth order or near zeroth order horizontal transverse modes without any higher order horizontal transverse modes lasing. When the semiconductor laser lases in the zeroth order or near zeroth order horizontal transverse modes, lasing in higher order horizontal transverse modes does not occur since the resonator acts only as a waveguide in terms of these higher order modes.

Structures which permit (or support) a plurality of horizontal transverse modes, such as refractive index waveguides and gain waveguides, have the following general characteristics.

In the case of refractive index waveguides, the number of horizontal transverse modes permitted therein is determined by the refractive index and width of the stripe and the differences in refractive index between the stripe and the adjoining regions. The greater these differences in refractive index and the greater the width of the stripe, the larger the number of permitted horizontal transverse modes tends to be. Further, the shorter the wavelength, the larger the number of permitted horizontal transverse modes.

In the case of gain waveguides, the number of horizontal transverse modes permitted therein is determined by the gain and width of the stripe. The higher the gain and the greater the width of the stripe, the larger the number of permitted horizontal transverse modes. Further, the shorter the wavelength, the larger the number of permitted horizontal transverse modes.

Second Embodiment

Figure 3:
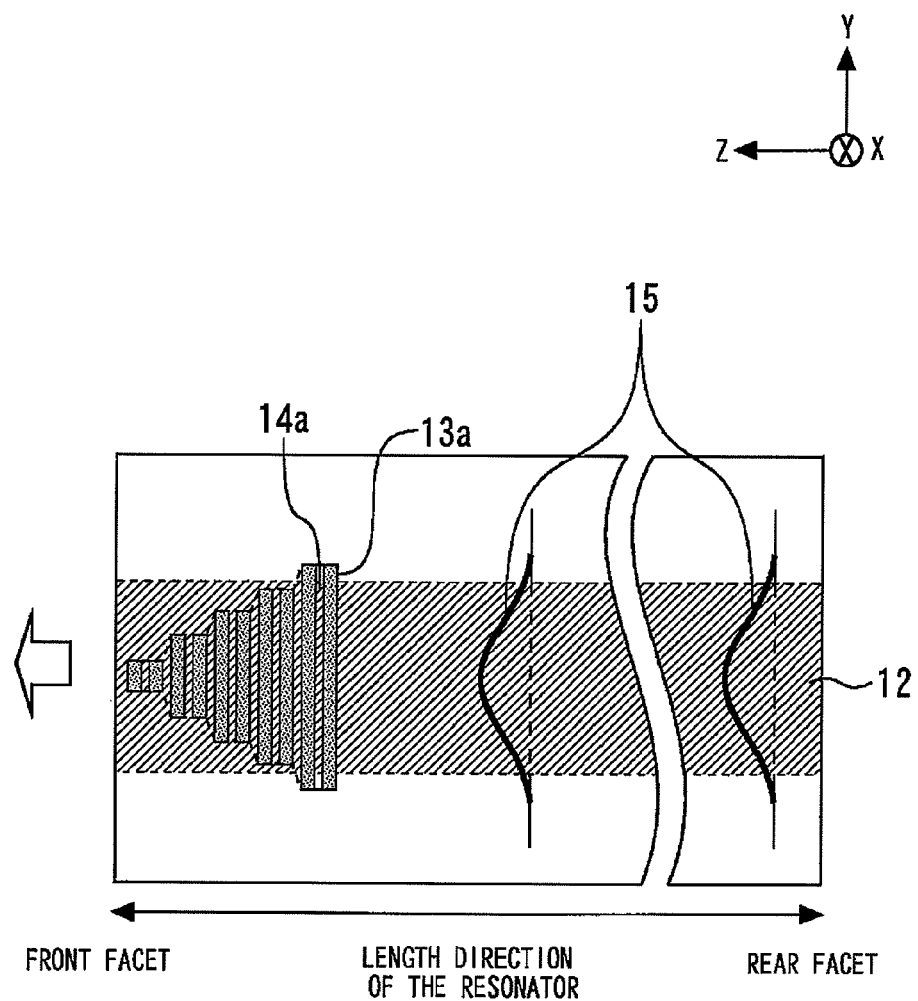
FIG. 3 is a schematic diagram showing the diffraction grating section of the broad area semiconductor laser of a second embodiment.

FIG. 3 is a schematic diagram showing the diffraction grating section of a broad area semiconductor laser in accordance with a second embodiment of the present invention. Specifically, FIG. 3 shows the surface (Y-Z plane) of the DBR forming layer after the layer has been grown and after a diffraction grating has been formed therein by etching away a series of spaced portions of the layer. It should be noted that the present embodiment is a variation of the configuration of the first embodiment. In FIG. 3, the reference numeral 13a denotes the trenches of the diffracting grating, and 14a denotes the ridges of the diffraction grating.

Since, in general, diffraction gratings are formed by use of an electron beam writing apparatus, the throughput can be increased by simplifying the forming program. The width of the diffraction grating of FIG. 3 in the Y-direction, which is perpendicular to the length direction of the resonator (Z-direction), does not continuously vary along the length of the resonator, but varies in five steps. As a result of these stepwise changes in the width of the diffraction grating, the reflectance in the stripe also varies stepwise with the distance from the longitudinal center line of the region. However, since the reflectance in the stripe is still higher at the longitudinal center portion of the stripe and lower at the longitudinal edge portions, this broad area semiconductor laser is also likely to lase in lower order modes than in higher order modes. It should be noted that although in the present embodiment the width of the diffraction grating varies in five steps, it is to be understood that the present invention is not limited to this number of steps and the width of the diffraction grating may vary in more or less than five steps.

Third Embodiment

Figure 4:
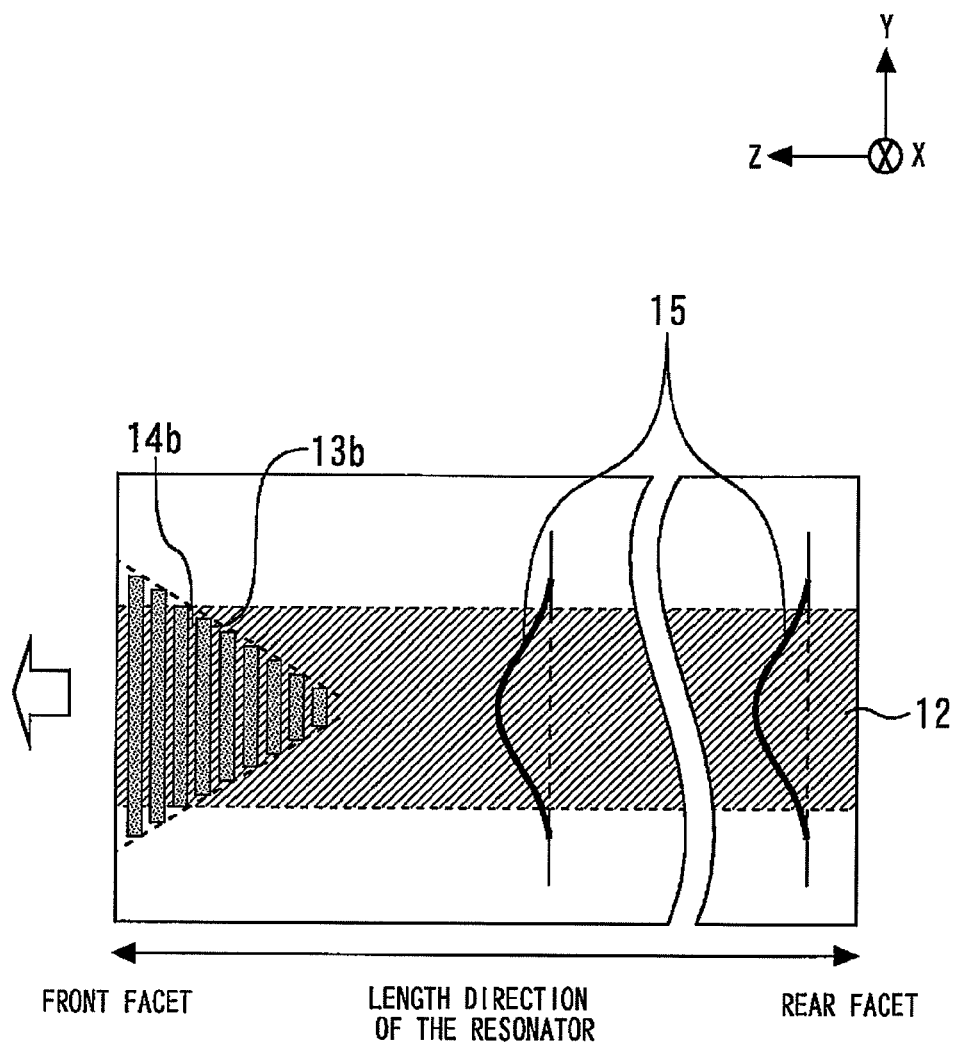
FIG. 4 is a schematic diagram showing the diffraction grating section of the broad area semiconductor laser of a third embodiment.

FIG. 4 is a schematic diagram showing the diffraction grating section of a broad area semiconductor laser in accordance with a third embodiment of the present invention. Specifically, FIG. 4 shows the surface (Y-Z plane) of the DBR forming layer after the layer has been grown and after a diffraction grating has been formed therein by etching away a series of spaced portions of the layer. In FIG. 4, the reference numeral 13b denotes the trenches of the diffraction grating, and 14b denotes the ridges of the diffraction grating.

In the broad area semiconductor laser of the third embodiment, the width of the diffraction grating in the Y-direction, which is perpendicular to the length direction of the resonator (Z-direction), decreases with increasing distance from the front facet of the resonator toward the rear facet thereof, as shown in FIG. 4. This change in the width of the diffraction grating is opposite in sense to those described in connection with the first and second embodiments. However, the area of the stripe covered by the diffraction grating also decreases with increasing distance from the longitudinal center line of the stripe toward the longitudinal edges of the stripe (which extend along the length of the resonator). Therefore, the reflectance in the stripe under the diffraction grating is high at the longitudinal center line of the stripe and decreases with increasing distance from the longitudinal center line toward the longitudinal edges. Therefore, this broad area semiconductor laser, like that of the first embodiment shown in FIGS. 1 and 2, can lase in low order horizontal transverse modes.

Fourth Embodiment

Figure 5:
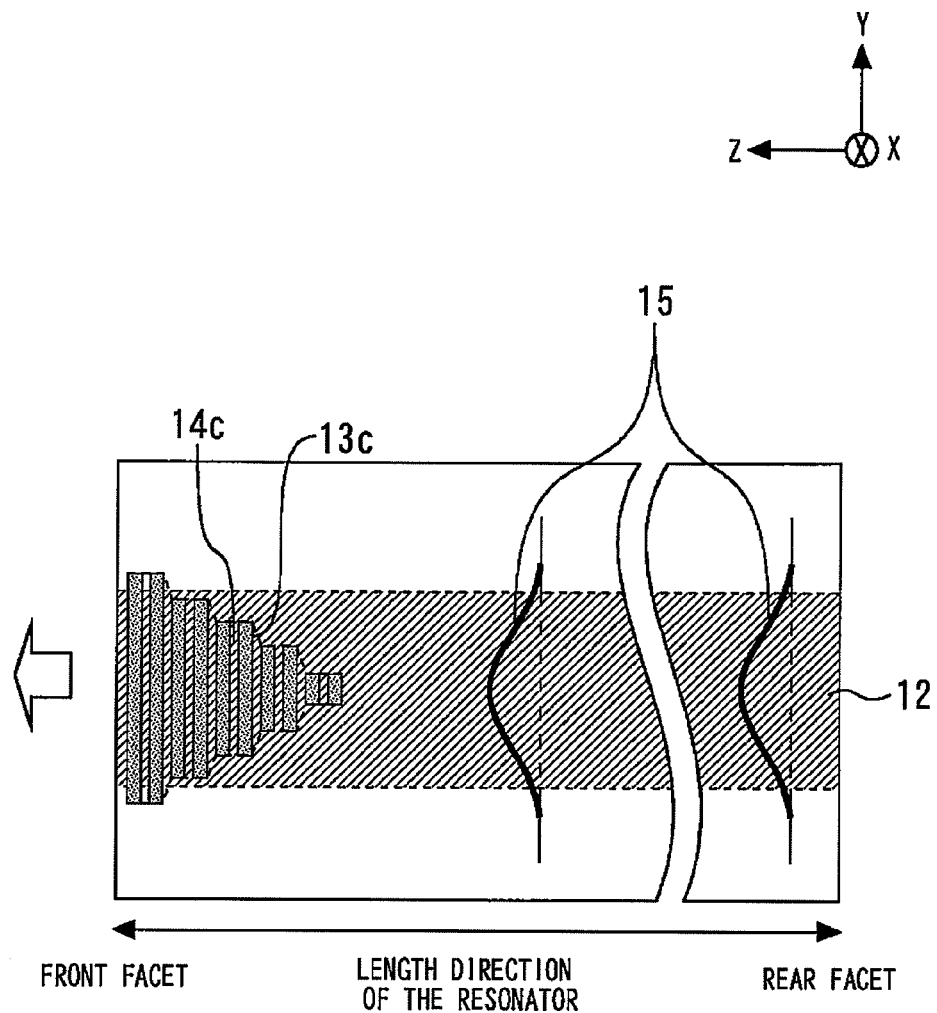
FIG. 5 is a schematic diagram showing the diffraction grating section of the broad area semiconductor laser of a fourth embodiment.

FIG. 5 is a schematic diagram showing the diffraction grating section of a broad area semiconductor laser in accordance with a fourth embodiment of the present invention. Specifically, FIG. 5 shows the surface (Y-Z plane) of the DBR forming layer after the layer has been grown and after a diffraction grating has been formed therein by etching away a series of spaced portions of the layer. It should be noted that the present embodiment is a variation of the configuration of the third embodiment described above.

In FIG. 5, the reference numeral 13c denotes the trenches of the diffraction grating, and 14c denotes the ridges of the diffraction grating. As shown in FIG. 5, the width of the diffraction grating does not continuously vary along the length of the resonator, but varies in steps. Also in this case the reflectance in the stripe is higher at the longitudinal center portion of the stripe and lower at the longitudinal edge portions of the stripe. Therefore, this broad area semiconductor laser can lase in low order horizontal transverse modes.

Fifth Embodiment

Figure 6:
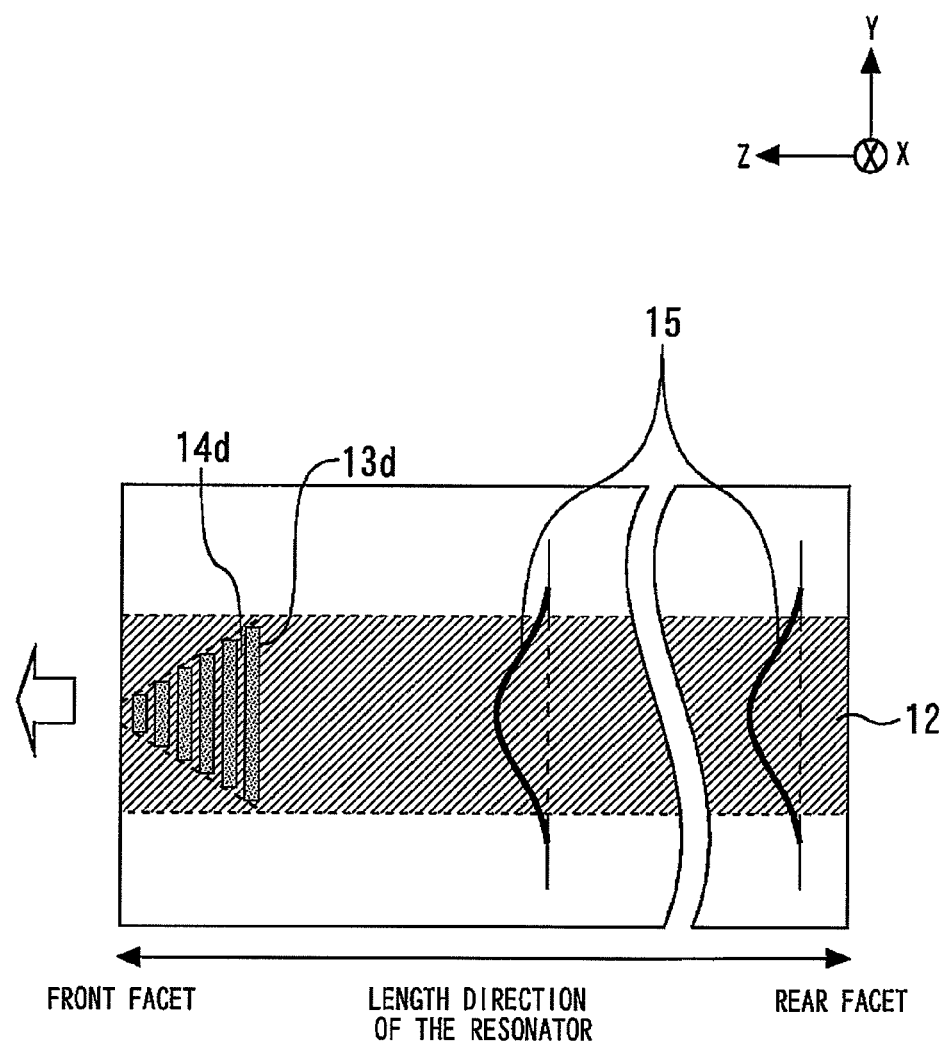
FIG. 6 is a schematic diagram showing the diffraction grating section of the broad area semiconductor laser of a fifth embodiment.

FIG. 6 is a schematic diagram showing the diffraction grating section of a broad area semiconductor laser in accordance with a fifth embodiment of the present invention. Specifically, FIG. 6 shows the surface (Y-Z plane) of the DBR forming layer after the layer has been grown and after a diffraction grating has been formed therein by etching away a series of spaced portions of the layer. In FIG. 6, the reference numeral 13d denotes the trenches of the diffraction grating, and 14d denotes the ridges of the diffraction grating. The effective width of a horizontal transverse mode (beam) in a broad area semiconductor laser can be represented by its spot size, which is the distance between the points where the electric field intensity is 1/e times the maximum electric field intensity.

In FIG. 6, the width of the diffraction grating in the Y-direction, which is perpendicular to the length direction of the resonator (Z-direction), increases with increasing distance from the front facet of the resonator toward the rear facet thereof, as in the first embodiment. However, the largest width of the diffraction grating in the Y-direction is approximately equal to the spot size of the fundamental mode. Even if the largest width of the diffraction grating in the Y-direction is smaller than the width of the horizontal transverse modes and is substantially equal to the spot size of the fundamental mode (as shown in FIG. 6), low order modes including the fundamental mode are strongly reflected by the diffraction grating, resulting in lasing in these low order modes.

Sixth Embodiment

Figure 7:
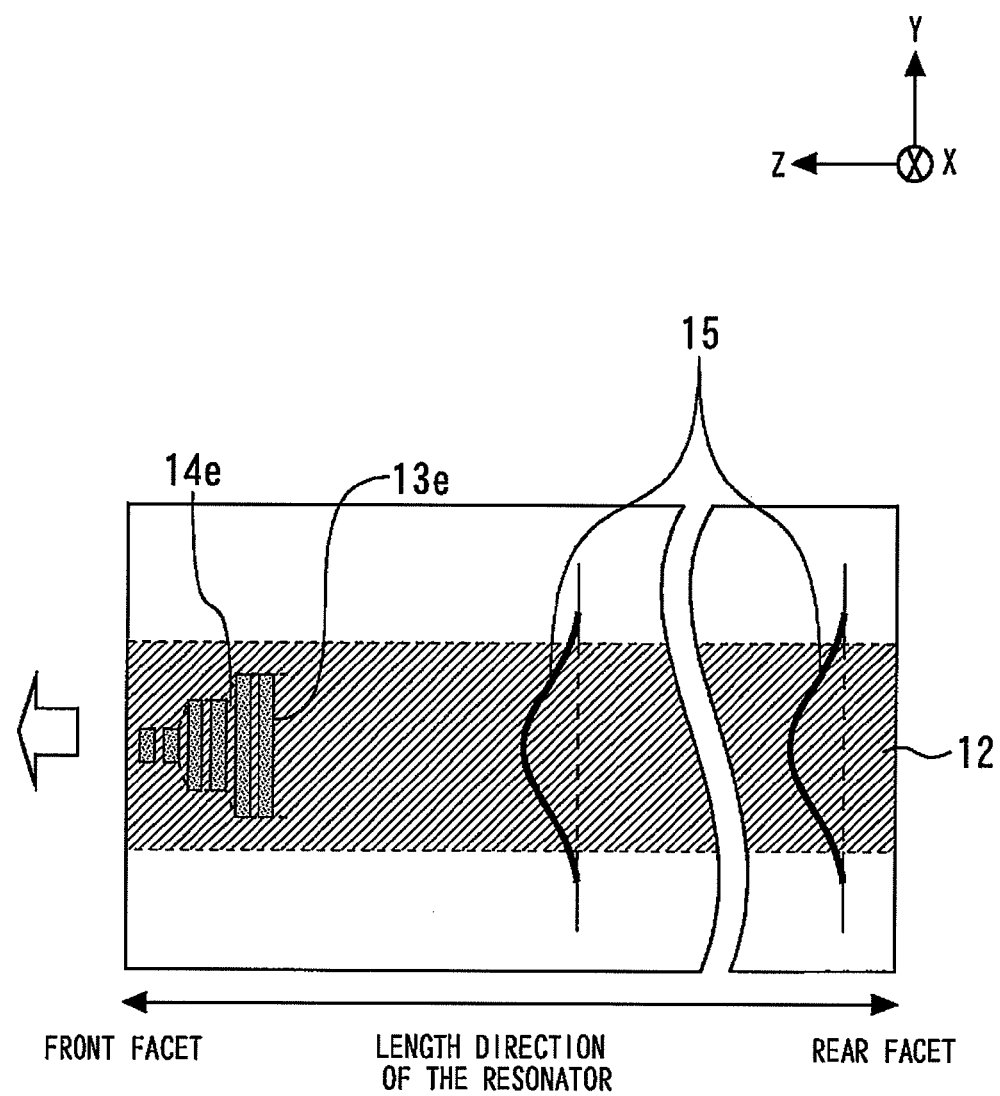
FIG. 7 is a schematic diagram showing the diffraction grating section of the broad area semiconductor laser of a sixth embodiment.

FIG. 7 is a schematic diagram showing the diffraction grating section of a broad area semiconductor laser in accordance with a sixth embodiment of the present invention. Specifically, FIG. 7 shows the surface (Y-Z plane) of the DBR forming layer after the layer has been grown and after a diffraction grating has been formed therein by etching away a series of spaced portions of the layer. In FIG. 7, the reference numeral 13e denotes the trenches of the diffraction grating, and 14e denotes the ridges of the diffraction grating. It should be noted that the present embodiment is a variation of the configurations of the second and fifth embodiments. The width of the diffraction grating in the Y-direction varies stepwise along the length of the resonator, and the largest width of the diffraction grating in the Y-direction is approximately equal to the spot size of the fundamental mode. Also in this configuration of the semiconductor laser of the present embodiment, low order horizontal transverse modes are strongly reflected by the diffraction grating, resulting in lasing preferentially in low order horizontal transverse modes.

Seventh Embodiment

Figure 8:
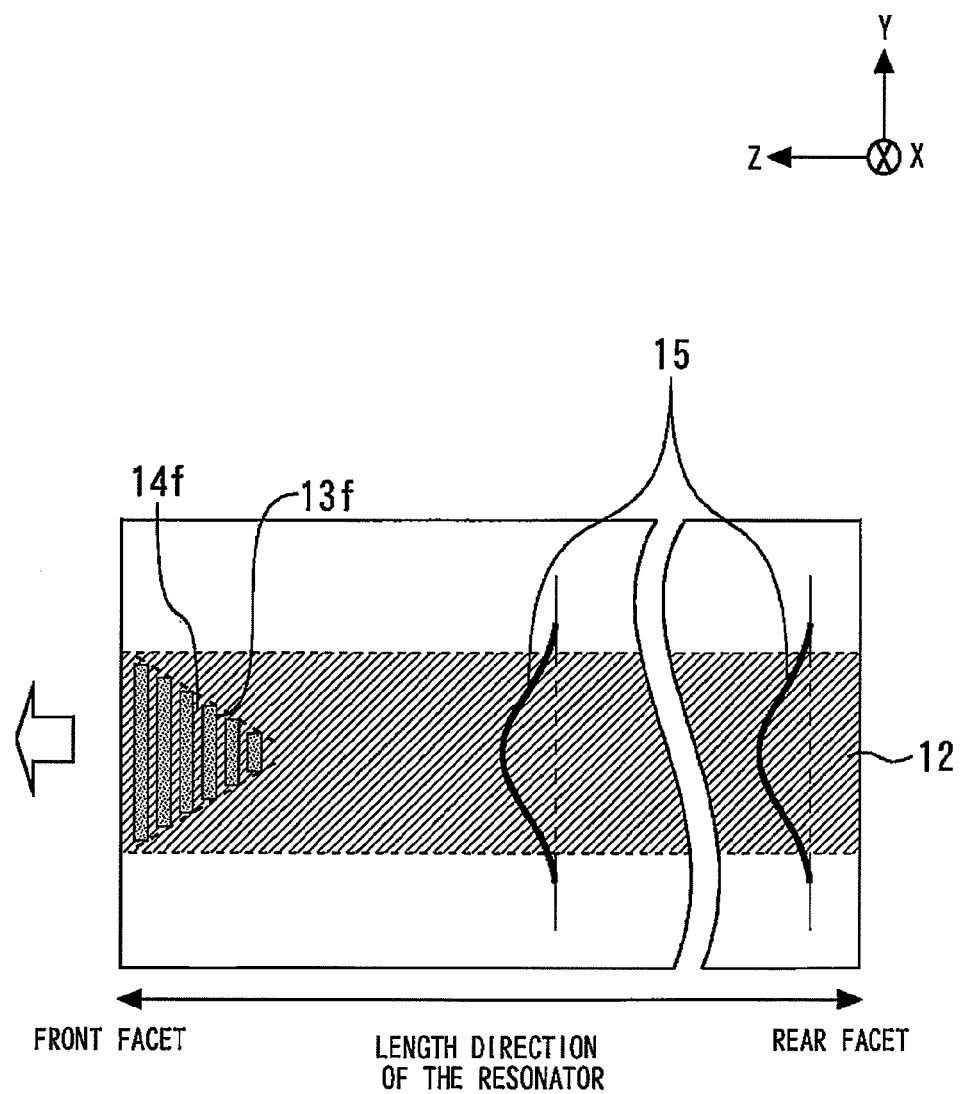
FIG. 8 is a schematic diagram showing the diffraction grating section of the broad area semiconductor laser of a seventh embodiment.

FIG. 8 is a schematic diagram showing the diffraction grating section of a broad area semiconductor laser in accordance with a seventh embodiment of the present invention. Specifically, FIG. 8 shows the surface (Y-Z plane) of the DBR forming layer after the layer has been grown and after a diffraction grating has been formed therein by etching away a series of spaced portions of the layer. In FIG. 8, the reference numeral 13f denotes the trenches of the diffraction grating, and 14f denotes the ridges of the diffraction grating. It should be noted that the present embodiment is a variation of the configuration of the third embodiment.

The width of the diffraction grating in the Y-direction, which is perpendicular to the length direction of the resonator (Z-direction), decreases with increasing distance from the front facet of the resonator toward the rear facet thereof, and the largest width of the diffraction gating in the Y-direction is approximately equal to the spot size of the fundamental mode. Also in this configuration of the broad area semiconductor laser of the present embodiment, low order horizontal transverse modes are strongly reflected by the diffraction grating, resulting in lasing preferentially in low order horizontal transverse modes.

Eighth Embodiment

Figure 9:
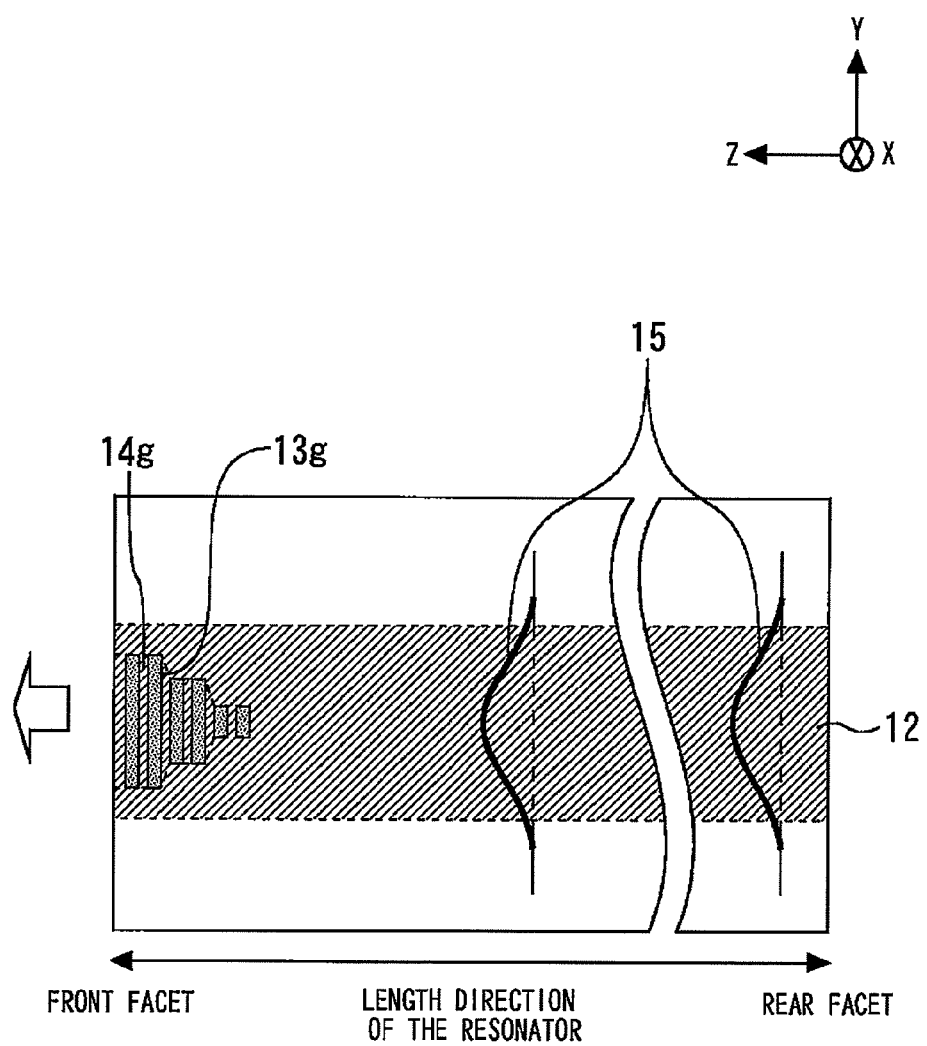
FIG. 9 is a schematic diagram showing the diffraction grating section of the broad area semiconductor laser of an eighth embodiment.

FIG. 9 is a schematic diagram showing the diffraction grating section of a broad area semiconductor laser in accordance with an eighth embodiment of the present invention. Specifically, FIG. 9 shows the surface (Y-Z plane) of the DBR forming layer after the layer has been grown and after a diffraction grating has been formed therein by etching away a series of spaced portions of the layer. In FIG. 9, the reference numeral 13g denotes the trenches of the diffraction grating, and 14g denotes the ridges of the diffraction grating. It should be noted that the present embodiment corresponds to a variation of the configurations of the fourth and seventh embodiments.

The width of the diffraction grating in the Y-direction, which is perpendicular to the length direction of the resonator (Z-direction), decreases stepwise with increasing distance from the front facet of the resonator toward the rear facet thereof, and the largest width of the diffraction grating in the Y-direction is approximately equal to the spot size of the fundamental mode. Also in this configuration of the broad area semiconductor laser of the present embodiment, low order horizontal transverse modes are strongly reflected by the diffraction grating, resulting in lasing preferentially in low order horizontal transverse modes.

In any of the semiconductor lasers of the embodiments described above, the width W of the diffraction grating along the Y-Z plane in the Y-direction, which is perpendicular to the length direction of the resonator (Z-direction), is different at a first location than at a second location along the length of the resonator. Therefore, at at least one location along the length of the resonator, the area of the stripe region covered by the diffraction grating is greater at the longitudinal center portion of the stripe region than at the longitudinal edge portions of the stripe region. As a result, the reflectance distribution in the stripe is such that the reflectance is higher at the longitudinal center line of the stripe and lower at the longitudinal edges of the stripe, thereby enabling the semiconductor laser to lase in the zeroth order or near zeroth order horizontal transverse modes.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2011-154934, filed on Jul. 13, 2011 including specification, claims, drawings and summary, on which the Convention priority of the present application is based, is incorporated herein by reference in its entirety.

The invention claimed is:

1. A semiconductor laser having a distributed Bragg reflector (DBR) structure, the semiconductor laser comprising:
   a front facet for emitting laser light generated in the semiconductor laser;
   a rear facet located at an opposite end of the semiconductor laser from the front facet;
   a stripe region extending from the front facet to the rear facet, wherein the stripe region includes generally parallel longitudinal edges and a center line between the longitudinal edges; and
   a DBR layer including a diffraction grating located in a grating region, near the front facet, wherein
   the grating region overlaps the stripe region, the diffraction grating is symmetrical with respect to the center line of the stripe region, and at least part of the diffraction grating is located outside the longitudinal edges of the stripe region.

2. The semiconductor laser according to claim 1, wherein the diffraction grating located in the grating region has a width which decreases continuously with increasing distance from the rear facet and decreasing distance from the front facet.

3. The semiconductor laser according to claim 1, wherein the diffraction grating located in the grating region has a width which increases continuously with increasing distance from the rear facet and decreasing distance from the front facet.

4. The semiconductor laser according to claim 1, wherein the diffraction grating located in the grating region has a width which decreases stepwise with increasing distance from the rear facet and decreasing distance from the front facet.

5. The semiconductor laser according to claim 1, wherein the diffraction grating located in the grating region has a width which increases stepwise with increasing distance from the rear facet and decreasing distance from the front facet.

\* \* \* \* \*